United States Patent
Yousif

(10) Patent No.: US 9,615,481 B1
(45) Date of Patent: * Apr. 4, 2017

(54) MODULAR MOUNT RACK FRAME

(71) Applicant: Gorgius L. Yousif, Chicago, IL (US)

(72) Inventor: Gorgius L. Yousif, Chicago, IL (US)

(*) Notice: Subject to any disclaimer, the term of this patent is extended or adjusted under 35 U.S.C. 154(b) by 73 days.

This patent is subject to a terminal disclaimer.

(21) Appl. No.: 14/714,123

(22) Filed: May 15, 2015

Related U.S. Application Data

(63) Continuation of application No. 13/068,471, filed on May 12, 2011, now Pat. No. 9,198,324, which is a continuation of application No. 11/364,495, filed on Feb. 28, 2006, now abandoned.

(51) Int. Cl.
  *H05K 7/18* (2006.01)
  *A47B 45/00* (2006.01)
  *A47B 47/00* (2006.01)

(52) U.S. Cl.
  CPC .............. *H05K 7/18* (2013.01); *A47B 45/00* (2013.01); *A47B 47/0091* (2013.01)

(58) Field of Classification Search
  CPC ........ H05K 7/183; H05K 7/186; H02B 1/012; H02B 1/013; H02B 1/308
  USPC ..... 211/175, 194, 26, 126.15, 189–192, 117, 211/118, 200, 204, 206; 312/223.1, 312/265.1–265.4, 334.4, 334.5, 111; 361/724–727, 829; 248/460; 220/4.02, 220/4.03, 8; 206/503
  See application file for complete search history.

(56) References Cited

U.S. PATENT DOCUMENTS

| | | | | |
|---|---|---|---|---|
| 3,563,624 A | * | 2/1971 | Stice ................... | A47B 47/042 312/107 |
| 4,664,265 A | * | 5/1987 | George, Jr. ............. | B25H 3/04 206/707 |
| 4,715,502 A | * | 12/1987 | Salmon .................... | H04Q 1/09 211/175 |
| 2005/0237721 A1 | * | 10/2005 | Cowley ................ | G02B 6/4455 361/727 |

* cited by examiner

*Primary Examiner* — Joshua Rodden
(74) *Attorney, Agent, or Firm* — Adrienne B. Naumann

(57) ABSTRACT

A modular mount rack frame for storing mounted devices is described herein. A first embodiment of a mount rack frame includes a modular rigid support structure with linearly aligned apertures into which screws can reversibly insert to support a mounted device. In a second embodiment, first and second support structures are stacked and aligned vertically, and they mechanically attach to each other. In this second embodiment, either the first support structure or the second support structure can support the other while contacting a flat horizontal surface. Both first and second embodiments can attach to a rack base for mobility across the flat horizontal surface. Each rigid support structure is also laterally adjustable in horizontal length.

18 Claims, 5 Drawing Sheets

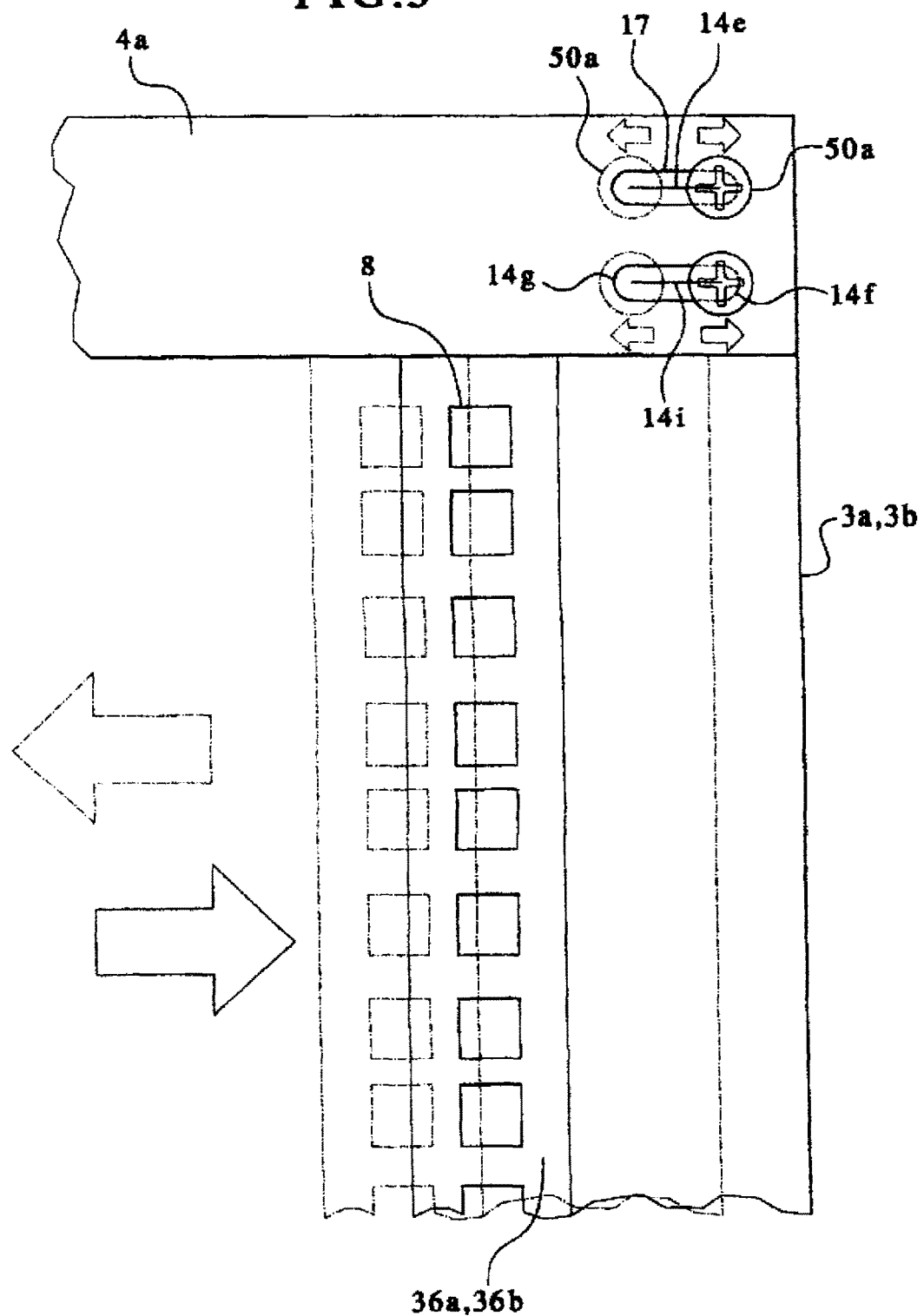

MODULAR MOUNT RACK FRAME

This application is a continuation of U.S. patent application Ser. No. 13/068,471 filed May 12, 2011, and which is a continuation of U.S. patent application Ser. No. 11/236,495 filed Feb. 28, 2006 and its specification and drawings are incorporated herein in their entirety.

BACKGROUND OF THE INVENTION

This invention relates to a mount rack frame for storing computer related devices such as servers, hubs, switches and routers. More particularly this invention relates to a mount rack frame with congruently aligned apertures for connecting plates, horizontal length adjustment, and vertically attaching two individual modular rigid support structures. Connecting brackets simultaneously attach to the devices and the mount rack frame, thereby effectively stacking them within the frame without shelves.

The prior art discloses cabinets for storage of computer related device which are expensive and cumbersome. They also require humidity and temperature controls because of their non-ventilated interior environment. Prior art storage structures also lack flexibility for adjusting the horizontal dimension of the mount rack frame whenever devices deviate from standard horizontal dimensions. Furthermore, because these prior art storage structures are not modular, they cannot stack vertically upon each other in an interchangeable manner. Prior art storage structures also do not exhibit reversibly attached rack bases by which the mount rack frame moves across a flat horizontal surface such as a floor.

The current mount rack frame solves these problems in an economical manner. With partially elliptical apertures and appropriate mechanical fasteners, the horizontal dimension within a standard mount rack frame is easily manually adjustable. The current mount rack frame is also lighter in weight, less expensive and easily assembled from interchangeable rigid components. If mobility is desired, each mount rack frame reversibly attaches to a rack base which includes wheels or coasters.

The current mount rack frame comprises numerous prototypes with dimensions which conform to standardized measurements (as well as multiples thereof) of the computer device industry. Because the mount rack frame is modular, one modular unit can vertically stack upon another modular unit which rests upon either the rack base or directly upon the flat horizontal surface.

SUMMARY OF THE INVENTION

The mount rack frame disclosed and claimed herein comprises at least one modular rigid support structure. Each modular rigid support structure contains two vertical components and two horizontal components, all of which are rigid and assembled within a very short time period. Each rigid horizontal component and rigid vertical component also contains partially elliptical apertures and screws. These apertures containing screws congruently align for horizontal adjustment of rigid vertical components, as well as for mechanical attachment to other rigid horizontal components.

Partially elliptical apertures containing screws are spaced along vertical and horizontal components in aperture pairs. Some partially elliptical apertures can contain a centrally positioned screw with a lateral clearance on either side of that screw of preferably and approximately 1/16 inch. As a result certain screws within specific partially elliptical apertures can move laterally, and this lateral movement results in an adjustable horizontal length between two rigid vertical components. These screws and partially elliptical apertures simultaneously attach vertical rigid components to horizontal rigid components.

Other congruently aligning apertures have different functions. For example, rigid horizontal components contain partially elliptical apertures for vertically aligning and attaching two modular rigid support structures to each other. There are also round apertures within rack base legs which attach a rack base to a single rigid support structure or two module mount rack frame.

There are also partially elliptical apertures within rigid vertical components for attaching (i) support plates with mechanical fasteners to stacked rigid support structures; and/or (ii) rack base legs to vertical rigid components.

Each rigid support structure has a horizontal length and vertical height of one 'U,' or a multiple thereof. A U is the unit of measurement in the computer industry, and each U designates a horizontal width of nineteen and a perpendicular height of one and three-quarters inches (for either an attached device or the actual mount rack frame). A second U standard designates a horizontal length of twenty-four inches, but the nineteen inch standard is more ubiquitous. Width (depth) of an attached device can vary and still remain within one U (or multiples thereof).

For example, a standard industry measurement of 3 U is equivalent to: (i) 57 inches in horizontal length of an attached device (or the modular rigid support structure), and (ii) 1.75×3 inches in height of the attached device (or vertical height interval along each rigid vertical component). Devices attach within each rigid support structure by sets of vertically and linearly aligned apertures and screws along the rigid vertical components. There are two sets of vertically and linearly aligned apertures along each rigid vertical component. As a result, the user can either attach the device more anterior or posterior along a modular rigid support structure.

In addition, each rigid vertical component end comprises apertures into which screws reversibly insert to attach a rack base. Each rack base comprises legs with locks, and coasters or wheels. These coasters or wheels provide mobility to the mount rack frame or single modular rigid support structure.

Each rigid horizontal component is interchangeable structurally and functionally with all other rigid horizontal components of the same length and width. Consequently any rigid horizontal component can function as an upper horizontal component or a lower horizontal component with respect to a supporting flat surface such as a floor. Each rigid horizontal component end contains partially elliptical apertures for (i) attaching a connecting plate to a two-module mount rack frame, or (ii) reversibly attaching a rack base to a rigid support structure.

To increase the storage capacity of the new mount rack frame, one modular rigid support structure is stacked and aligned vertically upon the other. Since each modular rigid support structure is identical in structure and function to the other, all rigid support structures function either as the bottom or upper (stacked) modular unit. Connecting plates, as well as additional screws, along the corresponding rigid horizontal components reversibly attach an upper aligned rigid support structure upon the lower modular rigid support structure.

Accordingly, it is a purpose of the present invention to provide an economical manner in which to store computer-related devices without the use of shelves.

It is also a goal of the present invention to provide an economical manner in which to store any device which can be mounted to a mount frame rack with brackets.

It is also a goal of the present invention to provide modular rigid support structures in which to store operable mounted devices.

It is also a goal for the present invention to provide a rack base attached to a modular rigid support structure for mobility.

It is another goal of the present invention to provide a device for adjusting the horizontal length of a modular rigid support structure.

It is another goal of the present invention to provide mechanical attachments by which a modular rigid support structure is vertically aligned upon another modular rigid support structure.

It is another goal of the present invention to provide modular rigid support structures which are structurally and functionally interchangeable with respect to vertical stacked alignment and attachment to a rack base.

These features, as well as other improvements of the present invention, are apparent after review of the attached figures and DETAILED DESCRIPTION OF THE PREFERRED EMBODIMENT, BEST MODE AND OTHER EMBODIMENTS.

BRIEF DESCRIPTION OF THE DRAWINGS

FIG. 5 is an isolated closeup schematic anterior view of the lateral movement of screws within partially elliptical apertures.

DETAILED DESCRIPTION OF THE PREFERRED EMBODIMENT, BEST MODE, AND OTHER EMBODIMENTS

Figure 1:
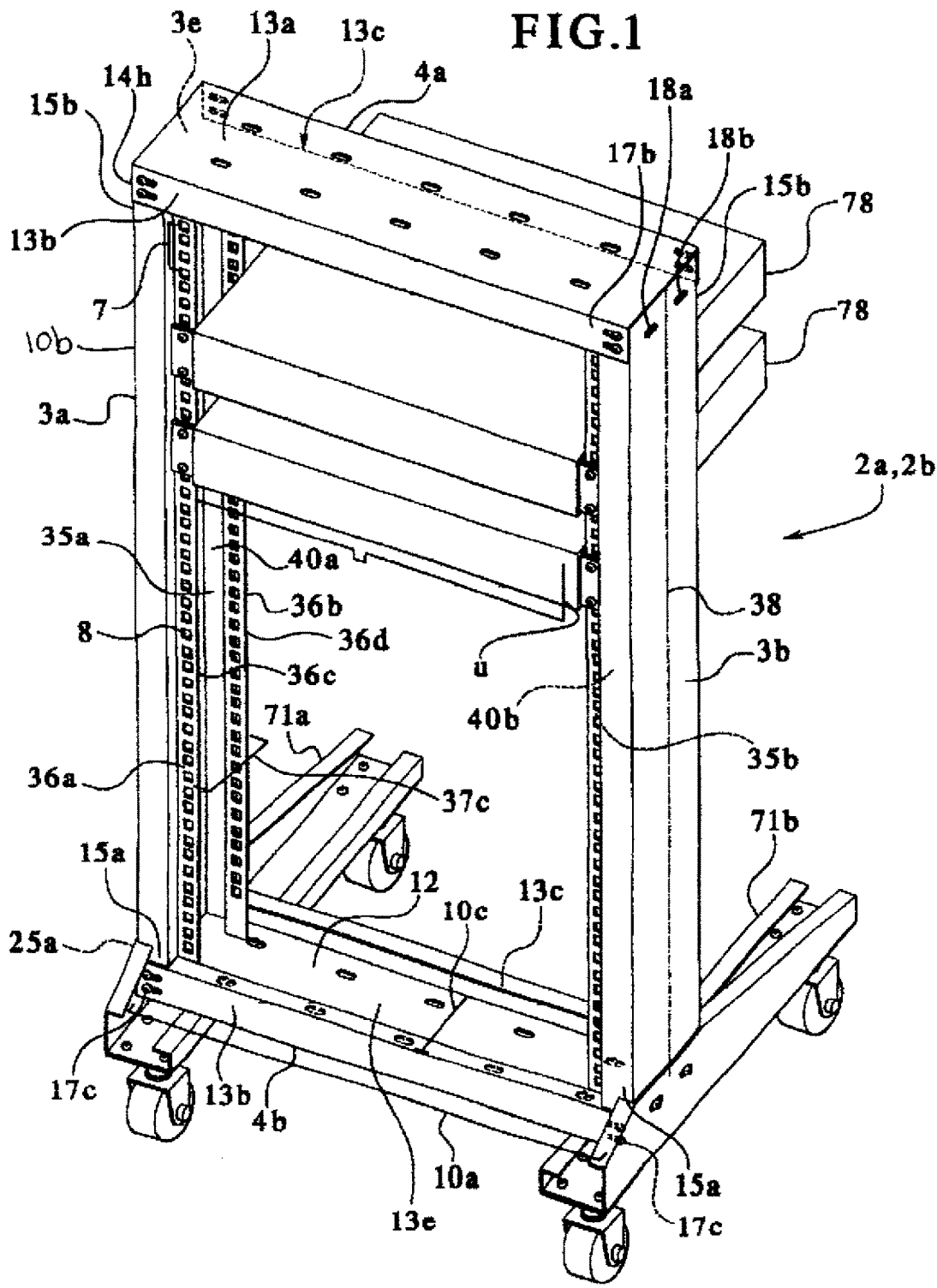
FIG. 1 is a partial anterior view of the mount support rack in the preferred one modular rigid support structure embodiment with two mounted devices.

Referring to FIG. 1, the preferred embodiment of the mount rack frame 1 comprises a first modular rigid support structure 2a. In the FIG. 4 embodiment, there is an additional attached second modular rigid support structure 2b. Each first and second rigid support structure 2a, 2b, as well as other modular rigid support structures (generically designated modular rigid support structures 2), may differ in horizontal length, height and depth. However, each modular rigid support structure 2a, 2b is identical in function and structure to the other.

Each first or second modular rigid support structure 2a, 2b can support itself and one additional vertically stacked additional rigid support structure 2a, 2b whenever entire mount rack frame 1 rests upon a flat horizontal surface such as a floor. The discussion below addresses a first modular rigid support structure 2a. However the description of structure, technical details and function also apply to modular second rigid support structure 2b, as well as other modular rigid support structures 2, unless otherwise noted.

Modular Rigid Support Structures 2a, 2b

Referring to FIG. 1 mounted devices 78 can be, although not exclusively: servers, hubs, switches or routers. Mounted device 78 comprises internationally designated U units. For example a device 78 which comprises one U unit is nineteen inches in length and one and three-quarter inches in height, although width (depth) can vary.

Still referring to FIG. 1, in the pending invention there is preferably a one U unit of vertical height (i.e., 1 and ¾ inches) for each subset 7 of three rack apertures 8. Because the international standard height U is 1 and ¾ inches, most manufacture design their devices 78 and brackets 75 accordingly. Each one U device 78 is generally approximately 1 and 11/16 inches in height, so when mounted there is approximately 1/32 inch of vertical space between vertically aligned adjacent devices 78. In the pending invention, each first and second rigid horizontal component 4a, 4b is preferably approximately twenty-three inches in horizontal length 10a to accommodate a single U mounted device 78. However, multiples of U are also within the scope of the pending invention.

Still referring to FIG. 1, in the preferred embodiment each modular first rigid support structure 2a comprises first rigid vertical component 3a and a second rigid vertical component 3b. Modular first rigid support structure 2a also comprises a first rigid horizontal component 4a and a second rigid horizontal component 4b. In the preferred embodiment the length 10a of one modular rigid support structure 2a is approximately 23 inches, height 10b is approximately 1.5 inches, and depth 10c (i.e., width of horizontal component 4a or 4b) is approximately 4.5 inches.

Each rigid component 3a, 3b, 4a, 4b is reversibly removable from remaining rigid components. Each horizontal rigid component 4a, 4b is structurally and functionally interchangeable with the other, while vertical rigid components 3a, 3b are also interchangeable, assuming their U values are identical.

Still referring to FIG. 1, rigid first and second horizontal components 4a, 4b respectively are parallel to each other when assembled into modular rigid support structure 2a. Each rigid horizontal component 4a, 4b comprises a corresponding upper horizontal surface 13a. Upper horizontal surface 13a integrally and continuously attaches perpendicular to downward adjoining protruding first horizontal side 13b and downward adjoining protruding second horizontal side 13c. Each downward protruding adjoining first and second horizontal sides 13b, 13c respectively forms a right angle with upper horizontal surface 13a. Each protruding adjoining first and second horizontal side 13b, 13c respectively is approximately 1.50 inches in width.

Still referring to FIG. 1, upper horizontal surface 13a and sides 13b, 13c are preferably approximately 1/16 inch in thickness and preferably comprise a metal sheet. Each first and second rigid horizontal component 4a, 4b respectively also comprises a corresponding lower horizontal surface 13e. Lower horizontal surface 13e comprises horizontal tract 12 into which first and second rigid vertical component ends 15a or 15b respectively insert and slide in a limited manner.

Figure 2:
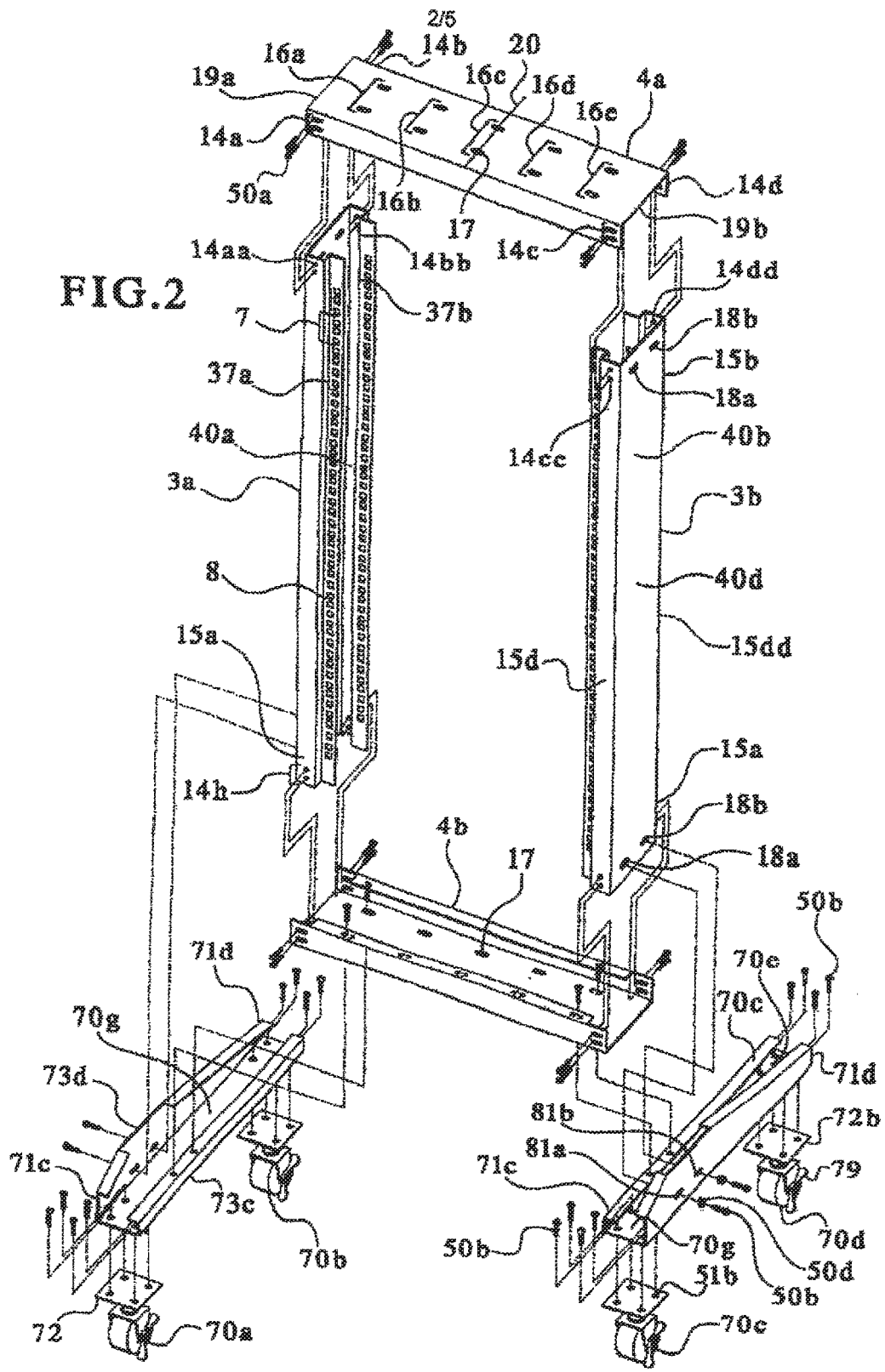
FIG. 2 is an exploded view of one modular rigid support structure to which a rack base attaches.

Referring now to FIG. 2, each first and second rigid horizontal component 4a, 4b respectively comprises first, second, third and fourth vertically aligned horizontal pairs 14a, 14b, 14c, 14d respectively (generically vertically aligned horizontal pairs 14) of partially elliptical apertures 17. One horizontal pair 14 is located at each first and second horizontal component end 19a, 19b respectively along first and second downward protruding horizontal sides 13b and 13c. Consequently, each aperture pair 14a, 14b, 14c, 14d respectively lies within a rigid horizontal component ends 19a, 19b of downward protruding horizontal sides 13b, 13c respectively of first rigid horizontal component ends 19a, 19b.

Similarly, each rigid vertical component end 15a, 15b comprises congruently aligning aperture vertical pairs 14aa, 14bb, 14cc, 14dd (generically aligned vertical pairs 14h). As best seen in FIG. 5, each partially elliptical aperture 17 is partially elliptical in shape and each aperture long axis 14e is parallel to length 10a of corresponding horizontal component 4a, 4b. Each partially elliptical aperture 17 within each rigid vertical component end 15a, 15b aligns its maximum longitudinal dimension 14e perpendicular to longitudinal length 10b of its corresponding rigid vertical component 3a or 3b. However, other aperture shapes and dimensions are also within the scope of the invention. Aperture pairs 14aa, 14bb, 14cc, 14dd lie within rigid vertical component ends 15a, 15b and first and second vertical component surfaces 14d and 14dd respectively.

Still referring to FIG. 5, preferably threaded small round screws 50a insert within each partially elliptical aperture 17. There is a maximum lateral clearance of approximately 1/16-inch on each side of a centrally positioned small round screw 50a within a partially elliptical aperture 17. Each small round screw head and large round screw head has a diameter of approximately 1/8-inch. Smaller round screw heads are preferred for wheel or coaster attachment while larger round screw heads are preferred for other attachments. In different embodiments, other kinds of mechanical fasteners are satisfactory.

Referring to FIG. 2, preferably first, second, third, fourth and fifth partially elliptical upper pairs 16a, 16b, 16c, 16d, and 16e respectively (generically upper aperture pairs 16) penetrate upper horizontal surface 13a. However, other numbers and shapes of aperture pairs 16 and apertures are within the scope of the invention. Adjoining partially elliptical upper aperture pairs 16 lie approximately 4.0 inches from each other. Each partially elliptical upper aperture pair 16 is parallel to remaining partially elliptical upper aperture pairs 14 within the same flat horizontal surface 13a.

Each partially elliptical aperture 17 within upper aperture pair 16 is preferably approximately 0.75 inch in maximum longitudinal length 14e, and comprises a midpoint 141 along length 14e. The same dimensions are also preferred for partially elliptical apertures 17 within aperture pairs 14 and aperture pairs 14h.

Still referring to FIG. 2 horizontally aligned first and second partially elliptical base apertures 18a, 18b respectively are located within rigid vertical component ends 15a, 15b along wide vertical component surface 40d. Vertical component surfaces 15d, 15dd are perpendicular and integrally attached to wide vertical component surface 40d which contains first and second partially elliptical base apertures 18a, 18b respectively.

Horizontally aligned first and second partially elliptical apertures 18a, 18b have two functions: (i) as insertion points for threaded small round screws 50b which attach first and second connector plates 90, 91 respectively to vertically stacked modular rigid support structures 2a, 2b infra; and (ii) for attachment of modular rigid support structure 2a, 2b to rack base legs 71a, 71b, infra.

Still referring to FIG. 2, in the preferred embodiment and best mode first and second rigid vertical components 3a, 3b respectively are parallel to each other when assembled within modular rigid support structure 2a. Rigid first and second horizontal components 4a, 4b respectively are parallel to each other and attach at a right angle to a vertical rigid vertical components 3a, 3b respectively when assembled as a modular rigid support structure 2a, 2b. When fully assembled each modular rigid support structure 2a, 2b forms a square or rectangle in one plane.

Referring to FIGS. 1 and 2, in the preferred embodiment each rigid vertical component 3a, 3b comprises crimped pair 37c of first and second crimped metal strips 36a, 36b respectively (generically crimped metal strips 36). Each crimped metal strip 36a, 36b of each crimped pair 37c respectively integrally attaches to the first or second interior vertical surface 35a, 35b respectively of a corresponding first or second rigid vertical component 3a, 3b respectively. Each first and second crimped metal strip 36a, 36b comprises a first and second exterior edge 36c, 36d respectively.

Still referring to FIGS. 1 and 2, first and second interior edges 37a, 37b respectively integrally attach to corresponding first and second interior vertical component surface 35a, 35b respectively. Each crimped metal strip 36a, 36b protrudes from, and is preferably perpendicular to, its corresponding interior vertical surface 35a or 35b. Each crimped pair 37c is parallel to its opposing crimped pair 37c along the opposing rigid vertical component 3a or 3b when modular rigid support structure 2a or 2b is completely assembled. Crimped metals strips 36a, 36b are also parallel to the long vertical component axis 38 of a corresponding rigid vertical component 3a or 3b. Each crimped metal strip 36a, 36b is preferably identical in structure and function to the other.

Referring to FIG. 1, each crimped metal rack strip 36a, 36b is preferably approximately 30 inches in longitudinal length and approximately 1.0 inch in horizontal width. However, other lengths which may depend upon rack U size are also satisfactory: Each vertical interior surface 35a, 35b respectively comprises an interior strip track 40a, 40b between first and second crimped metal rack strips 36a, 36b respectively of one crimped pair 37c. Each first crimped metal strip 36a is approximately two and three-quarters inches anterior to second crimped metal strip 36b of its crimped pair 37c. Each crimped metal strip 36a, 36b is approximately 1/16 to 3/32 inch in thickness.

Referring now to FIG. 1, within each first and second crimped metal strip 36a, 36b respectively are rack sets 7 respectively. Preferably rack sets 7 comprise three linearly and vertically aligned rack apertures 8 within a corresponding first and second exterior edge 36c or 36d respectively. There are preferably sixteen aligned rack sets 7 within each crimped rack metal strip 36a, 36b, and each rack set 7 is approximately 1.75 inches in vertical length 38 (the international standard is: exactly 1.75 inches). However, other numbers of rack sets 7 are also within the scope of the invention. Each rack aperture 8 is preferably either approximately 0.25 inch or one-eighth inch from adjacent rack aperture 8 within its respective rack set 7. There is preferably approximately 0.25 inch between consecutive rack sets 7, and each individual square rack aperture 8 is preferably square in configuration, and approximately three-eighths inch in length and width.

Figure 3:
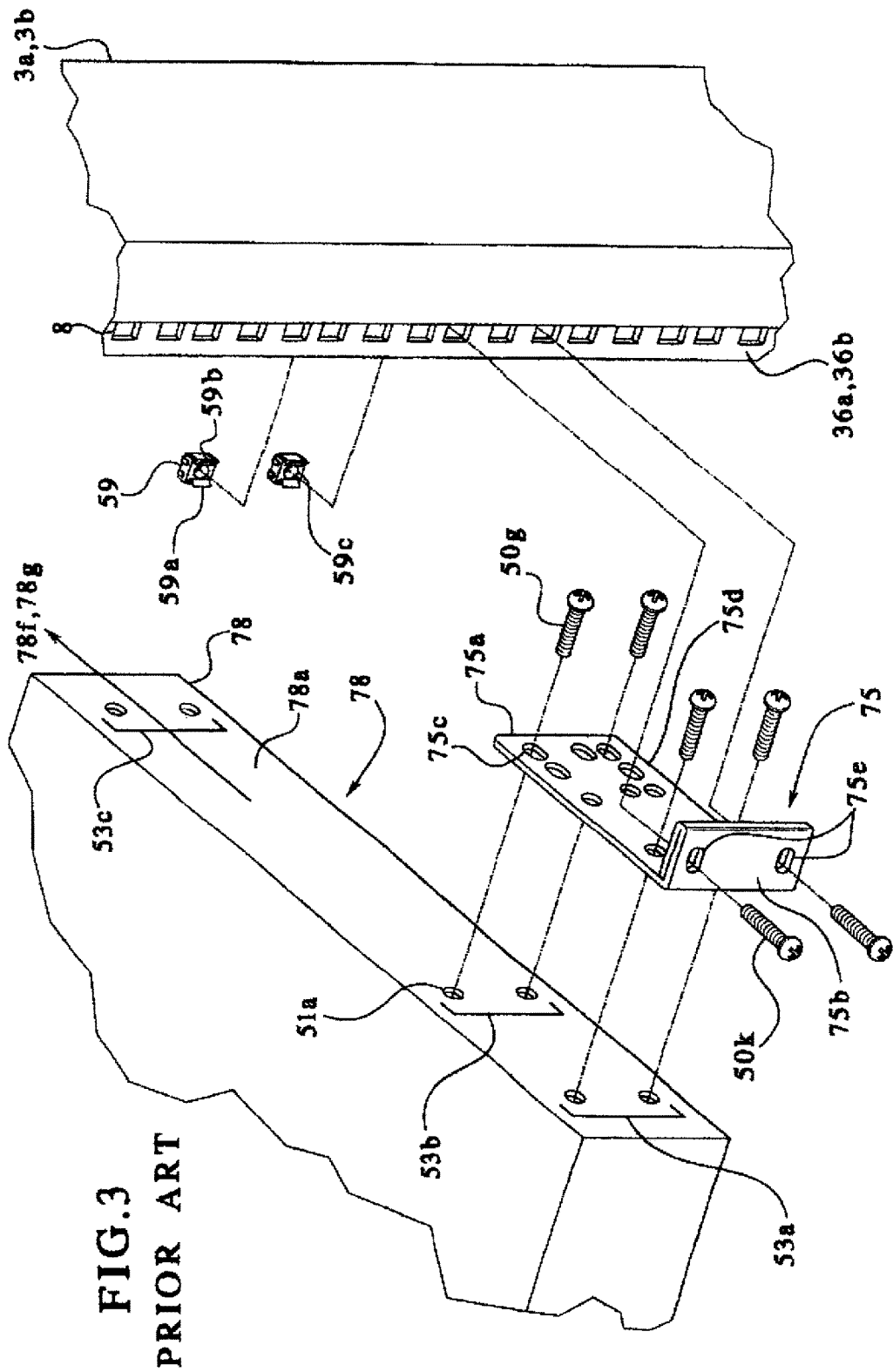
FIG. 3 is a closeup view of a connecting bracket attaching to linearly aligned rack apertures and a mounted device in the prior art.

Referring now to FIG. 3 of the preferred embodiment, prior art mounting brackets 75 reversibly and preferably attach to mounted device 78 by countersink or bevel head screws 50g. Screws 50g are preferred because they fit flush along a bracket surface. However, other satisfactory prior art mounting brackets 75, screws and devices 78 currently exist in diverse prototypes, depending upon the manufacturer. In additional embodiments other mechanical fasteners are also within the scope of the invention.

Still referring to FIG. 3, countersink or bevel head screws 50g reversibly insert into small round threaded screw apertures 51a within each opposing first and second device side 78a, 78b respectively (not seen in this view). Preferably first, second and third mounting aperture pairs 53a, 53b, 53c (generically mounting aperture pairs 53) of small round screw apertures 50a are preferably equidistantly spaced along each opposing first and second device sides 78a, 78b respectively in an anterior/posterior direction 78g. Each mounting aperture pair 53 also aligns perpendicular to depth 78f of opposing first and second sides 78a, 78b respectively.

Still referring to FIG. 3, each prior art mounting bracket 75 preferably comprises flat bracket end 75a, bracket flat segment 75d, and bent bracket end 75b. Flat bracket end 75b comprises flat end apertures 75c, and each flat end aperture 75c can congruently align with a small round threaded screw aperture 51a. In this manner counter-sink or beveled head small round screw 50g inserts through a congruently aligned aperture 51a of a pre-selected mounting aperture pair 53 and flat end aperture 75c. Bent bracket end 75b is integrally part of, but perpendicular to, bracket flat segment 75d. Bent bracket end 75b comprises bent bracket apertures 75e, through which preferably large round Phillips head or straight head screws 50k insert. Straight head screws 50k are identical in structure and function to large round screws 50b.

Still referring to FIG. 3, prior art conventional cage nut 59 comprises first and second opposing crimped flanges 59a, 59b, a square configuration and centrally positioned threaded round cage aperture 59c. Cage nut 59 is approximately ⅜ inch square. Cage nut 59 inserts within a single rack aperture 8 and is held therein by opposing first and second cage flanges 59a, 59b. Opposing cage flanges 59a, 59b protrude from single rack aperture 8, thereby maintaining cage nut 59's position within rack aperture 8. Round threaded screws 50k insert within threaded round cage aperture 59c.

Rack Base 60

Referring to FIGS. 1 and 2, removable rack base 60 preferably comprises first, second, third and fourth rack coasters 70a, 70b, 70c, 70d (generically rack coasters 70), although wheels are also satisfactory. There are also first and second rack base legs 71a, and 71b respectively. Two rack coasters 70 attach to a first and a second rack base 71a, 71b respectively in a manner well known in the art, and each rack coaster 70 comprises prior art lock 79.

Prior art locks 79 prevent mount rack frame 1 from inadvertent swiveling along a flat surface. These prior art-locking mechanisms are well known in the wheel and coaster attachment industry. Large round screws 50b are preferred for attachment of rack base 60 to each rigid support structure 2a, 2b, infra.

Still referring to FIGS. 1 and 2, rack coasters 70 attach to each rack base leg 71a, 71b at anterior base end 71c or posterior base end 71d. Rack coasters 70 attach to base legs 71a, 71b by pivoting conventional prior art attachments 51b and mechanical fasteners. However, small round screws 50b are preferred. Corresponding first and second round leg apertures 81a, 81b respectively within each first and second rack base leg 71a, 71b can congruently align with first and second base partially elliptical apertures 18a, 18b respectively within vertical component ends 15a, 15b.

In the preferred embodiment large round screws 50b and circular washers 50d attach rack base 60, infra, to each corresponding rigid vertical component end 15a or 15b. However other mechanical fasteners are also satisfactory in different prototypes of the invention.

Still referring to FIGS. 1 and 2, each first and second rack base leg 71a, 71b respectively comprise a flat lowest side 73c and an upwardly slanting side 73d. Lower rack base leg interior surface 70e contains base leg track 70g. Each rack base leg 71a, 71b is preferably approximately 20.0 inches in length in an anterior/posterior direction and aligns perpendicular to attached modular rigid support structure 2a or 2b. Preferably each rack base leg 71a, 71b is structurally and functionally identical to the other.

Still referring to FIGS. 1 and 2, each first and second rack base leg 71a, 71b respectively attaches to corresponding vertical component end 15a or 15b approximately 6.5 inches posterior to each corresponding first and second anterior rack base leg end 71c. Each rack base leg 71a, 71b is approximately two and three-quarters inches in width. Each rack base leg 71a, 71b is approximately 2.5 inches in height where upwardly slanted side 73d attaches to each corresponding vertical component end 15a or 15b as the case may be.

Each upwardly slanting side 73d is preferably approximately 1.50 inches in height at anterior leg end 71c and posterior leg end 71d. Flat lower side 73c is uniformly approximately 0.75 inch in height. Each side 73c, 73d preferably consists of a metal sheet which bends at a right angle to form base track 70g.

Connecting Plates 90, 91

Figure 4:
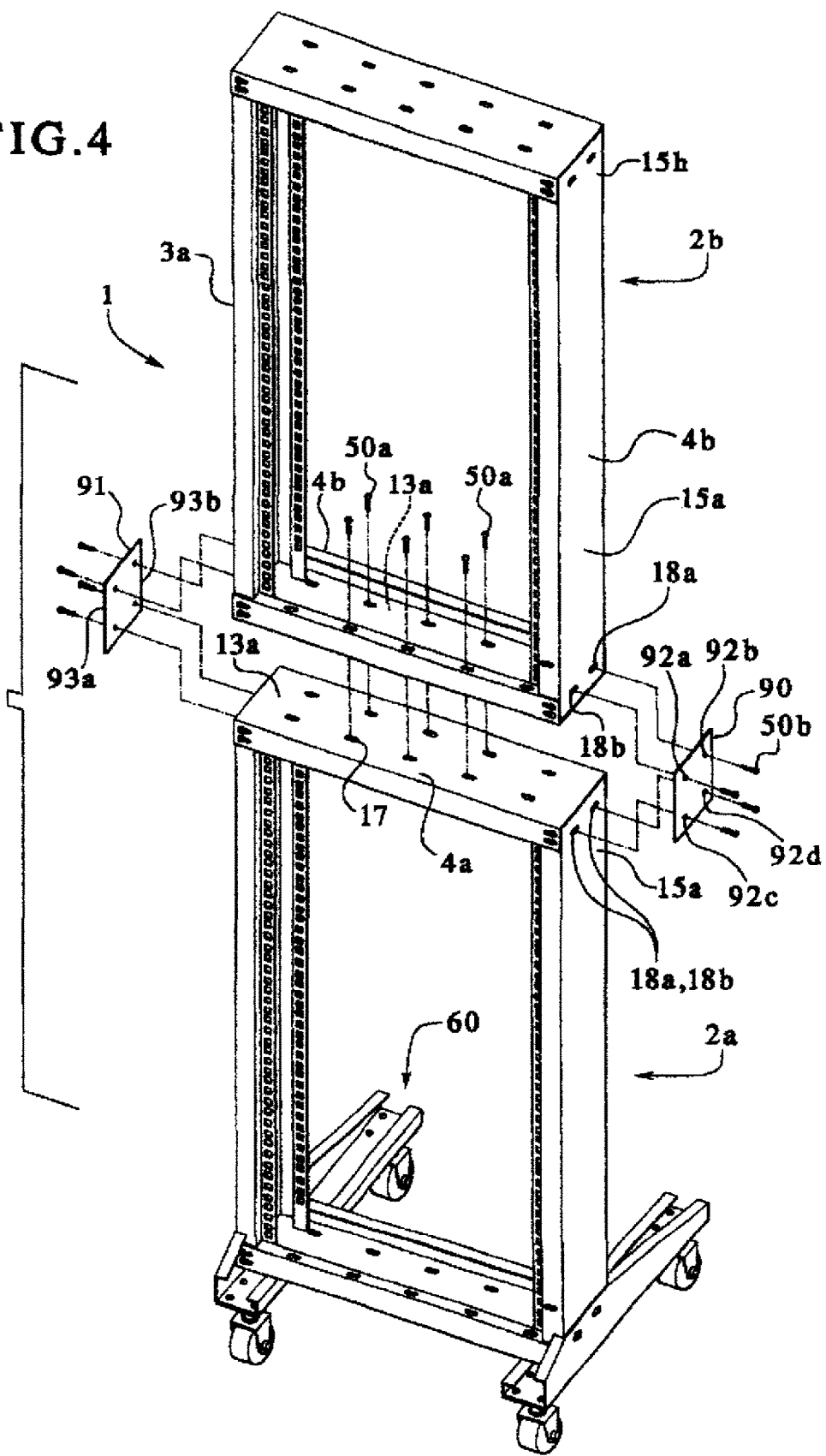
FIG. 4 is an exploded view of assembly for two modular rigid support structures vertically stacked upon each other.

Referring now to FIG. 4, in another embodiment mount frame rack 1 comprises both first and second modular rigid support structures 2a, 2b respectively. In this embodiment mount rack frame 1 preferably comprises a first rigid flat connecting plate 90 and a second rigid flat connecting plate 91 for additional mechanical stability and rigidity. Each connecting plate 90, 91 is preferably structurally and functionally identical to the other with the same length, width and thickness. Preferably connecting plates 90, 91 are square or rectangular in length and width, but other shapes are also satisfactory. Preferably each connecting plate 90, 91 is approximately 3.5 inches in length, 3.5 inches in width and 1/16 inch in thickness.

Still referring to FIG. 4, each first and second connecting plate 90, 91 respectively preferably comprises four circular plate apertures 92a, 92b, 92c, 92d (generically plate apertures 92), although other numbers of plate apertures 92 are also satisfactory. Each plate aperture 92 lies approximately 0.25 inch from the first or second corresponding longitudinal opposing plate edge 93a or 93b respectively.

Plate apertures 92 are preferably equidistantly spaced from each other along plate edges 93a, 93b. Each plate aperture 92 is circular and of sufficient diameter to receive a large round threaded screw 50b. Plate apertures 92 can congruently align with corresponding horizontally aligned partially elliptical apertures 18a, 18b along vertical component ends 15a or 15b. Preferably component plate apertures 92 have the same diameter as each other.

Assembly of a Modular Rigid Support Structure 2a, 2b in the Best Mode

Referring now to FIG. 2, to assemble a single modular rigid support structure 2a or 2b, the operator initially selects a first rigid vertical component 3a and a first rigid horizontal component 4a. He or she next inserts rigid vertical component end 15a within a horizontal component end 19a. He or she then inserts a small round screw 50a respectively through congruently aligned partially elliptical apertures 17 within first and second partially elliptical apertures pairs 14a/14aa and 14b/14bb.

The operator now selects second rigid vertical component 3b and inserts its rigid vertical component end 15a within second horizontal component end 19b. He or she also inserts second rigid vertical component ends 15b (of rigid vertical components 3a, 3b) within rigid horizontal ends 19a, 19b of a second rigid horizontal component 4b. He or she then congruently aligns partially elliptical apertures 17 within remaining vertical aperture pairs 14, 14h of first and second rigid horizontal components 4a, 4b and first and second rigid vertical components 3a, 3b respectively.

The operator then inserts and tightens small round screw 50a into each corresponding partially elliptical aperture 17 of each congruently aligned pair 14/14h as follows: 14a/14aa; 14b/14bb; 14c/14cc; and 14d/14dd. In the last step the operator checks to insure that all vertical component ends 15a, 15b and horizontal component ends 19a, 19b attach by congruently aligned partially elliptical apertures 17 with inserted small round screws 50a as described supra.

Referring to FIG. 2, to attach rack base 60 to modular rigid support structure 2a or 2b, the operator selects one rack base leg 71a or 71b. He or she then inserts a single large round screw 50b within a corresponding congruently aligned base screw and leg aperture 18a/81a or 18b/81b. He or she then adds a washer 50d to each large round screw 50b and tightens corresponding single large round screw 50b and washer 50d.

Still referring to FIG. 2, the operator repeats this procedure for remaining rack base leg 71b with congruently aligned apertures 18a/81a and 18b/81b respectively. In this procedure, as with initial assembly of a modular rigid support structure 2a, 2b supra, in the best mode first and second rigid vertical components ends 15a, 15b, as well as first and second rigid horizontal component ends 19a, 19b are interchangeable with each other.

Assembly of Mount Rack Frame 1 in the Best Mode

Referring now to FIG. 4 the operator places modular first rigid support structure 2a with attached rack base 60 upon a rigid horizontal surface. He or she then places modular second rigid support structure 2b upon first rigid horizontal component 4a of first support structure 2a in a vertically aligned manner. Either rigid horizontal component 4a or 4b of modular second rigid support structure 2b can contact rigid horizontal component 4a of first rigid support structure 2a, because rigid horizontal components 4a, 4b are interchangeable, assuming identical structure and dimensions.

Still referring to FIG. 4, the operator (i) congruently aligns partially elliptical aperture pairs 16 of partially elliptical apertures 17 within first horizontal upper surface 13a of first rigid support structure 2a with (ii) corresponding partially elliptical aperture pairs 16 within upper horizontal surface 13a of second rigid support structure 2b. The operator inserts and tightens a round small screw 50a through aligned partially elliptical apertures 17 within each congruently aligned partially elliptical aperture pair 16.

Still referring to FIG. 4, the operator next selects first connector plate 90. He or she congruently aligns first and second plate apertures 92a, 92b respectively with corresponding first and second base screw apertures 18a, 18b respectively (within rigid vertical component end 15a of rigid vertical component 3b of second modular rigid support structure 2b). He or she also congruently aligns third and fourth vertical plate apertures 92c, 92d respectively (within the same connector plate 90) with partially elliptical base apertures 18a, 18b within second rigid component end 15b of first modular rigid support structure 2a.

The operator then inserts a small round screw 50b through each of the four pairs of congruently aligned apertures 18a/92a, 18b/92b and 18a/92c, 18b/92d. The operator repeats this same procedure with second connector plate 91 along rigid vertical component ends 15a, 15b of the remaining rigid vertical component 3a. Attachment of modular rigid support structures 2a, 2b to each other is thereby mechanically strengthened by connecting plates 90, 91.

Attachment of Mounted Device 78 to Mount Rack Frame 1 in the Best Mode

Referring now to FIG. 3, the operator aligns mounting bracket 75 to first opposing device side 78a. He or she inserts a single screw 50g within each corresponding congruently aligned device aperture 51a and bracket apertures 75c. During this step, preferably the operator inserts at least two screws 50g within two corresponding device apertures 51a. The operator then inserts a cage nut 59 within each of at least two corresponding rack apertures 8 along one crimped metal strip 36a or 36b. He or she inserts each cage nut 59 so first and second cage nut flanges 59a, 59b respectively protrude from its corresponding rack aperture 8.

Still referring to FIG. 3, the operator now orients mounting bracket 75 so preferably two bent bracket apertures 75e congruently align with two corresponding cage nuts 59 within their respective rack apertures 8. However, other numbers of bent bracket apertures 75e, with corresponding rack apertures 8 and cage nuts 59, are also within the scope of the invention. The operator next inserts and tightens a Philips screw 50k through each corresponding congruently aligned rack apertures 8, bent segment aperture 75e, and cage nut aperture 59c.

During this step the operator inserts screw 50k into cage nut aperture 39c in a direction through the maximum opening of protruding cage nut flanges 59a, 59b. The operator repeats this identical process on the second opposing device side 78b (not seen in FIG. 4), and thereby attaches second opposing side 78b to corresponding crimped metal strip 36a or 36b.

The operator can orient mounting bracket bent end 75b so it attaches to rack apertures 8 of posterior crimped metal strip 36b or anterior crimped metal strip 36a of one rigid vertical components 3a or 3b. However, in other embodiments mounting options depend upon a particular manufacturer's features. To remove mounted device 78, the operator removes each Phillips screw 50k from congruently aligned cage nut 59, rack aperture 8 and bent racket aperture 75e with opposing device sides 78a and 78b.

Referring now to FIGS. 1, 2 and 5, many mounting device 78 deviate from the U industry standard of 19 inches of horizontal length 10a. In addition, prior art brackets 75 often contain variations in thickness of bent segment 75b and flat segment 75d. These variations may interfere with precise fittings between rack apertures 8 and mounted device opposing sides 78a, 78b. To solve this problem, for each modular rigid support structure 2a, 2b or two modular unit mount rack fame 1, the operator can laterally adjust the effective horizontal length 10a of rigid horizontal components 4a and/or 4b.

To do so, the operator loosens each small round screw 50a within partially elliptical congruently aligned aperture pairs 14 and 14h. In particular, the operator loosens small round screws 50a within both first and second rigid vertical ends 15a, 15b of rigid vertical component 3a and/or 3b. The operator must also loosen and remove screws 50b and washers 50d from aligned apertures 18a/81a, 18b/81b. In this manner either rigid vertical end 15a, 15b of a single rigid vertical component 3a or 3b can now move within its respective horizontal track 12.

As seen in schematic FIG. 5, to increase horizontal length 10a of modular rigid support structure 2a or 2b, the operator manually moves each rigid vertical component 3a or 3b (or both) laterally outward within each corresponding horizontal track 12 (by rigid vertical ends 15a, 15b) until each small round screw 50a abuts outermost edge 14f of its corresponding partially elliptical aperture 17.

To decrease horizontal length 10a the operator manually moves each rigid vertical component 3a or 3b (or both) laterally inward within each corresponding track 12 until each small round screw 50a abuts innermost edge 14g of corresponding partially elliptical aperture 17. Screws 50b and washers 50d within congruently aligned apertures 18a/81a and 18b/81 must be loosed and removed, as with increasing horizontal length 10a, supra.

Materials and how to Produce Mount Rack Frame Components in the Best Mode

Preferably rigid vertical components 3a, 3b and rigid horizontal components 4a, 4b are made of SPCC quality cold rolled steel. However, materials such as copper or other rigid materials are also satisfactory. Screws 50a, 50b, 50g, 50k, are preferably made of SPCC quality cold rolled steel, but materials such as copper or other rigid materials are also satisfactory. Rack base legs 71a, 71b are preferably made of SPCC quality cold rolled steel, but copper or other rigid materials are also satisfactory.

Mechanical prior art attachments to coasters on rack base 60 are preferably made of SPCC cold rolled steel, but copper or other rigid materials are also satisfactory. Cage nuts 59 and washers 50d are preferably made of SPCC quality cold rolled steel, but copper or other rigid materials are also satisfactory. Prior art connecting brackets 75 are preferably made of SPCC quality cold rolled steel, but copper or other rigid materials are also satisfactory.

Factory production of mount rack frame 1 components proceeds as follows:
(a) Mold production;
(b) Shear of steel sheets by numerically controlled computers;
(c) Punching of sheared plate sheets;
(d) Bending and folding of sheared metal plate sheets by numerically controlled computers; and
(e) Application of a surface finish which includes:
  (1) degreasing;
  (2) acid pickling;
  (3) rust prevention and parkerizing applications;
  (4) pure water cleaning; and
  (5) static electricity prevention plastic which is painted upon the metal surface

The invention claimed is:

1. A mount rack frame comprising:
A. A first rigid multi-component support structure and a second rigid multi-component rigid support structure, each said rigid multi-component support structure comprising a first rigid vertical component and a second rigid vertical component,
said first rigid multi-component support structure and said second rigid multi-component support structure each comprising a first rigid upper horizontal component and a second rigid lower horizontal component,
said mount rack frame comprising a horizontal dimension,
said first rigid vertical components and said second rigid vertical components attaching to connecting brackets,
said connecting brackets reversibly attaching said rigid multi-component support structures to mounted devices, and
B. A rack base, said first rigid multi-component support structure or said second rigid multi-component support structure reversibly attaching to said rack base,
each said first rigid multi-component support structure or said second rigid multi-component support structure functioning as a mount rack frame without the remaining said first rigid multi-component support structure or remaining said second rigid multi-component support structure whenever said first rigid multi-component support structure or said second rigid multi-component support structure attaches to said rack base, and
C. Aligned aperture pairs, said aligned aperture pairs comprising a first group of aligned aperture pairs, said first group of aligned aperture pairs containing a first group of corresponding mechanical fasteners, and
a second group of at least four aligned aperture pairs, said second group of at least four aligned aperture pairs containing a second group of corresponding mechanical fasteners, said second group of said at least four aligned aperture pairs being located along said rigid horizontal components,
said first group of aligned aperture pairs containing said first group of said corresponding mechanical fasteners adjusting said horizontal dimension of said mount rack frame in a continuous manner solely within said first group of aligned aperture pairs,
said second group of aligned aperture pairs with said corresponding inserted mechanical fasteners reversibly attaching said first rigid multi-component support structure and said second rigid multi-component support structure in vertical alignment to each other.

2. The mount rack frame as described in claim 1 wherein said second group of aligned aperture pairs is in linear alignment along said rigid horizontal rigid components,
said second group of said aligned aperture pairs comprising a first portion of aligned aperture pairs and a second portion of aligned aperture pairs,
said first portion of said second group of said aligned aperture pairs being positioned within said upper rigid horizontal components, and said second portion of said second group of said aligned aperture pairs located within said lower rigid horizontal components,
said first portion congruently aligning with said second portion of said second group of said aligned aperture pairs, said first portion being in combination with said corresponding mechanical fasteners,
said corresponding mechanical fasteners inserting within said congruently aligned ones of the aligned aperture pairs within said first portion and said second portion,
said corresponding mechanical fasteners thereby reversibly attaching said first rigid multi-component support structure to said second multi-component support structure.

3. The mount rack frame of claim 1 wherein each said vertical rigid support component comprises a first rigid vertical component end and a second rigid vertical component end, and each rigid horizontal component comprises a first horizontal component end and second horizontal component end,
said first group of said aligned aperture pairs comprising a first portion of said first group of aligned aperture pairs and a second portion of said first group of said aligned aperture pairs,
said first portion of said first group of said aligned aperture pairs being located within said first rigid vertical component ends and said second rigid vertical component ends,
said second portion of said first group of aligned aperture pairs being positioned within said first and second rigid horizontal component ends,
said first portion and said second portion of said first group of said aligned aperture pairs congruently aligning with each other, said congruently aligned first portion and second portion of said first group of said aligned aperture pairs attaching said rigid vertical components to said rigid horizontal components in combination with said corresponding mechanical fasteners, said corresponding mechanical fasteners inserting within said congruently aligned first portion and second portion of said first group of said aligned aperture pairs, said first portion and said second portion of said first group of aligned apertures adjusting said horizontal dimension of said mount rack frame in combination with said corresponding mechanical fasteners.

4. The mount rack frame of claim 1 wherein said rigid horizontal components comprise said second group of aligned aperture pairs, said second group of aligned aperture pairs further comprising a first portion of said second group of said aligned aperture pairs and a second portion of said second group of said aligned aperture pairs, said first portion of said second group of said aligned aperture pairs congruently aligning with said second portion of said second group of said aligned aperture pairs in combination with said corresponding mechanical fasteners, said corresponding mechanical fasteners attaching said first multi-component support structure to said second multi-component support structure along said rigid horizontal components by insertion of said corresponding mechanical fasteners within said congruently aligned first and second portions of said second group.

5. A mount rack frame comprising:
A. A single rigid multi-component support structure further comprising:
  (1) a first rigid vertical component and a second rigid vertical component, a first rigid horizontal component and a second rigid horizontal component,
  said rigid horizontal components each comprising a horizontal length, said horizontal length being perpendicular to said first rigid vertical component and said second rigid vertical component,
  said first rigid vertical component and said second rigid vertical component each comprising a first vertical component end and a second vertical component end,
  each said first rigid horizontal component and second rigid horizontal component comprising a first horizontal component end and a second horizontal component end,
  said first rigid vertical component and second rigid vertical component being parallel to and opposing each other,
  and
  (2) aligned aperture pairs, said aligned aperture pairs consisting of a first group of aligned aperture pairs, a second group of aligned aperture pairs, and a third group of aligned aperture pairs,
  said first group of said aligned aperture pairs positioned within said rigid horizontal component ends and said rigid vertical component ends,
  said first group of aligned aperture pairs adjusting a horizontal dimension of said mount rack frame in a continuous manner in combination with a first group of inserted mechanical fasteners,
  said second group of said aligned aperture pairs positioned within said first rigid horizontal component and said second rigid horizontal component,
  said second group of said aligned aperture pairs being in parallel alignment with said length of said first rigid horizontal component and said second rigid horizontal component,
  said second group of said aligned aperture pairs comprising an upper plurality and a lower plurality of said aligned aperture pairs, said upper plurality positioned within said first rigid horizontal component, said lower plurality positioned within said second rigid horizontal component,
  said upper plurality of said second group of said aligned aperture pairs congruently aligning with said lower plurality of said second group of aligned aperture pairs,
  said congruently aligned upper plurality and lower plurality of said aligned aperture pairs containing a second group of said corresponding inserted mechanical fasteners,
  said first group and said second group of said aligned aperture pairs each comprising individual apertures, each individual aperture being configured to reversibly receive a corresponding said mechanical fastener from said first group or said second group of said inserted mechanical fasteners,
  and
B. A rack base, said single rigid multi-component rack frame reversibly attaching to said rack base by said third group of aligned aperture pairs in combination with a third group of inserted mechanical fasteners.

6. The mount rack frame as described in claim 5 wherein said rack base comprises rack base legs, and each said rack base leg comprises a predetermined longitudinal length and an anterior rack base leg end,
  each said rack base leg being approximately twenty inches in said longitudinal length,
  each said rigid vertical support attaching to one of said corresponding rack base legs approximately 6.5 inches from said anterior end of said rack base leg,
  said rack base legs of said predetermined longitudinal length thereby providing the sole support of balancing attached mounted devices.

7. A mount rack frame comprising:
A. A first rigid multi-component support structure and a second rigid multi-component rigid support structure,
  each said rigid multi-component support structure comprising a first rigid vertical component and a second rigid vertical component,
  said first rigid multi-component support structure and said second rigid multi-component support structure each comprising a first rigid upper horizontal component and a second rigid lower horizontal component,
  said mount rack frame comprising a first horizontal dimension,
  said first rigid vertical components and said second rigid vertical components attaching to connecting brackets,
  said connecting brackets reversibly attaching said rigid multi-component support structures to mounted devices,
B. A rack base, said first rigid multi-component support structure or said second rigid multi-component support structure reversibly attaching to said rack base,
  each said first rigid multi-component support structure or said second rigid multi-component support structure functioning as a mount rack frame without the remaining
  said first rigid multi-component support structure or remaining said second rigid multi-component support structure whenever said first rigid multi-component support structure or said second rigid multi-component support structure attaches to said rack base, and C. Aligned aperture pairs, said aligned aperture pairs comprising a first group of aligned aperture pairs, said first group of aligned aperture pairs containing a first group of corresponding mechanical fasteners, and a second group of aligned aperture pairs, said second group of aligned aperture pairs containing a second group of corresponding mechanical fasteners, said first group of aligned aperture pairs containing said first group of corresponding mechanical fasteners adjusting said horizontal dimension of said mount rack frame in a continuous manner, said second group of aligned aperture pairs with said second group of corresponding inserted mechanical fasteners reversibly attaching said first rigid multi-component support structure and said second rigid multi-component support structure in vertical alignment to each other, wherein said rigid vertical components each comprise a first vertical component end and a second vertical component end, said first vertical component end and said second vertical component end each comprising a single sole and only third aligned aperture pair, said mount rack frame further comprising a first connector plate and second connector plate, each said first connector plate and second connector plate comprising circular plate apertures, said circular plate apertures congruently aligning with each said single sole and only third aligned aperture pair, said first connector plate and said second connector plate reversibly attaching to said first vertical component ends and said second vertical component ends in combination with said third aligned aperture pairs and a third group of inserted mechanical fasteners, said rack base attaching to said first vertical component ends or said second vertical component ends in combination with said third group of inserted mechanical fasteners and said third aligned aperture pairs.

8. A mount rack frame comprising:

A. A single rigid multi-component support structure further comprising:
  (1) a first rigid vertical component and a second rigid vertical component, a first rigid horizontal component and a second rigid horizontal component, said rigid horizontal components each comprising a horizontal length, said horizontal length being perpendicular to said first rigid vertical component and said second rigid vertical component, said first rigid vertical component and said second rigid vertical component each comprising a first vertical component end and a second vertical component end, each said first rigid horizontal component and second rigid horizontal component comprising a first horizontal component end and a second horizontal component end, said first rigid vertical component and second rigid vertical component being parallel to and opposing each other, and (2) aligned aperture pairs, said aligned aperture pairs consisting of a first group of aligned aperture pairs, a second group of aligned aperture pairs, and a third group of aligned aperture pairs, said first group of said aligned aperture pairs positioned within said rigid horizontal component ends and said rigid vertical component ends, said first group of aligned aperture pairs adjusting a horizontal dimension of said mount rack frame in a continuous manner in combination with a first group of inserted mechanical fasteners, said second group of said aligned aperture pairs positioned within said first rigid horizontal component and said second rigid horizontal component, said second group of said aligned aperture pairs being in parallel alignment with said length of said first rigid horizontal component and said second rigid horizontal component, said second group of said aligned aperture pairs comprising an upper plurality and a lower plurality of said aligned aperture pairs, said upper plurality positioned within said first rigid horizontal component, said lower plurality positioned within said second rigid horizontal component, said upper plurality of said second group of said aligned aperture pairs congruently aligning with said lower plurality of said second group of aligned aperture pairs, said first group and said second group of said aligned aperture pairs each comprising individual apertures, each said individual aperture being configured to reversibly receive a corresponding said mechanical fastener, and B. A rack base, said single rigid multi-component support structure reversibly attaching to said rack base by said third group of aligned aperture pairs in combination with a third group of mechanical fasteners, said rack base not comprising shelves.

9. A mount rack frame comprising:

A. A first rigid multi-component support structure and a second rigid multi-component rigid support structure, each said rigid multi-component support structure comprising a first rigid vertical component and a second rigid vertical component, said first rigid multi-component support structure and said second rigid multi-component support structure each comprising a first rigid upper horizontal component and a second rigid lower horizontal component, said rigid horizontal components and said rigid vertical components each being physically distinct and separate from each other, each said rigid horizontal component and each said rigid vertical components each being reversibly removable from each other, said rigid multi-component support structures reversibly attaching to mounted devices, said mounted devices each comprising lateral sides, and B. A rack base, said first rigid multi-component support structure or said second rigid multi-component support structure reversibly attaching to said rack base, said rack base comprising a physically separate and distinct structure from said first rigid multi-component support structure and said second rigid multi-component support structure, each said first rigid multi-component support structure or said second rigid multi-component support structure functioning as a mount rack frame without the remaining said first rigid multi-component support structure or remaining said second rigid multi-component support structure whenever said first rigid multi-component support structure or said second rigid multi-component support structure attaches to said rack base, and C. Aligned aperture pairs comprising individual apertures, said aligned aperture pairs comprising
a first group of aligned aperture pairs, said first group of aligned aperture pairs containing a first group of corresponding inserted mechanical fasteners, and
a second group of at least four said aligned aperture pairs, said second group of at least four said aligned aperture pairs containing a second group of corresponding inserted mechanical fasteners,
said second group of at least four said aligned aperture pairs being positioned along said rigid horizontal components,
said first group of said inserted corresponding mechanical fasteners adjusting a linear dimension of said mount rack frame in a continuous manner exclusively while remaining within each said aperture of said first group of aligned aperture pairs,
said first group of said corresponding inserted mechanical fasteners attaching said rigid vertical components to said rigid horizontal components,
said second group of said corresponding inserted mechanical fasteners reversibly attaching said first rigid multi-component support structure and said second rigid multi-component support structure in vertical alignment to each other,
and
a third group of said aligned aperture pairs with a third group of corresponding inserted mechanical fasteners,
said third group of said corresponding inserted mechanical fasteners attaching said mounted devices along lateral sides of the mount rack frame,
said third group of said corresponding inserted mechanical fasteners being the sole and exclusive attachments of each said mounted device to said mount rack frame.

10. The mount rack frame as described in claim 9, said rack base consisting of the sole physical support of said mount rack frame,
said rack base comprising a first rack base leg and a second rack base leg,
said rack base legs each comprising a longitudinal rack base length,
said rigid vertical supports each attaching in a perpendicular manner at a corresponding point along a corresponding said longitudinal rack base length.

11. The mount rack frame as described in claim 9 wherein said rack base comprises two rack base legs and casters, each said rack base leg being approximately twenty inches in longitudinal length.

12. The mount rack frame as described in claim 9 wherein said rack base comprises rack base legs, and each said rack base leg comprises a predetermined longitudinal length and an anterior rack base leg end,
each said rack base leg being approximately twenty inches in said longitudinal length,
each said rigid vertical support attaching to one of said corresponding rack base legs approximately 6.5 inches from said anterior end of said rack base leg,
said rack base legs of said predetermined longitudinal length thereby providing the sole support of balancing said attached mounted devices.

13. The mount rack frame of claim 9 wherein said mount rack frame does not comprise shelves.

14. The mount rack frame as described in claim 9 wherein said individual apertures of the first and second group of aligned aperture pairs each being partially elliptical in shape.

15. The mount rack frame of claim 9 wherein
each said individual aperture comprising a longitudinal length and a width, said longitudinal length being greater than said width,
said longitudinal length of each said individual aperture of said first group of said aligned aperture pairs being perpendicular to a longitudinal length of said rigid vertical components,
a first plurality of said first group of said aligned aperture pairs being located within said rigid horizontal components, and
a second plurality of said first group of said aligned aperture pairs being located within said rigid vertical components,
said first plurality of said first group of said aligned aperture pairs congruently aligning with said second plurality of said first group of said aligned aperture pairs.

16. The mount rack frame of claim 9 wherein each said rigid vertical component comprises a first rigid vertical component end and a second rigid vertical component end, and
each rigid horizontal component comprises a first horizontal end and a second horizontal component end,
said first group of said aligned aperture pairs comprising a first portion of said first group of aligned aperture pairs and a second portion of said first group of said aligned aperture pairs,
said first portion of said first group of said aligned aperture pairs being located within said first rigid vertical component ends and said second rigid vertical component ends,
said second portion of said first group of aligned aperture pairs being positioned within said first and second rigid horizontal component ends,
said first portion of said first group of aligned aperture pairs and said second portion of said first group of said aligned aperture pairs congruently aligning with each other,
said congruently aligned first portion and second portion of said first group of said aligned aperture pairs attaching said rigid vertical components to said rigid horizontal components in combination with corresponding said first group of said corresponding inserted mechanical fasteners,
said corresponding first group of inserted mechanical fasteners inserting within said congruently aligned said first portion of said first group of aligned aperture pairs and second portion of said first group of said aligned aperture pairs,
said first portion of said first group of aligned aperture pairs and said second portion of said first group of aligned apertures and said corresponding first group of said inserted mechanical fasteners reversibly attaching said rigid horizontal components to said rigid vertical components, and
said corresponding first group of said inserted mechanical fasteners reversibly and continuously adjusting said linear dimension.

17. The mount rack frame of claim 9 wherein said rigid vertical components comprise a fourth group of said aligned aperture pairs,
and said rack base comprise a fifth group of said aligned aperture pairs, said mount rack frame further comprising attachment devices, said attachment devices being physically and structurally separate from said corresponding inserted mechanical fasteners, said fourth group of said aligned aperture pairs further comprising a fourth group of corresponding inserted mechanical fasteners, a first portion of said fourth group of said aligned aperture pairs congruently aligning with said fifth group of said aligned aperture pairs, a first portion of said fourth group of said corresponding inserting mechanical fasteners inserting within said congruently aligning said first portion of said fourth group of said aligned aperture pairs and said fifth group of said aligned aperture pairs, and a second portion of said fourth group of said corresponding inserted mechanical fasteners attaching said attachment devices to said rigid vertical components, said attachment device each comprising an attachment device longitudinal length, said attaching device attaching one said rigid vertical component into vertical alignment with a second said rigid vertical component, each said attachment device longitudinal length being perpendicular to a longitudinal length of said rigid vertical components, said first portion of said fourth group of said aligned aperture pairs with said first portion of said fourth group of said corresponding inserted mechanical fasteners and said second portion of said fourth group of said aligned aperture pairs with said second portion of said fourth group of said corresponding inserted mechanical fasteners being interchangeable with each other.

18. The mount rack frame as described in claim 9 wherein said second group of said aligned aperture pairs is in linear alignment with each other along said rigid horizontal rigid components, said second group of said aligned aperture pairs comprising a first series of said aligned aperture pairs and a second series of said aligned aperture pairs, said first series of said second group of said aligned aperture pairs being positioned within an upper horizontal surface of said first rigid horizontal component, and said second series of said second group of said aligned aperture pairs being positioned within an upper horizontal surface of said second said rigid horizontal component, said first series congruently aligning with said second series of said second group of said aligned aperture pairs, said congruently aligning said first series and said congruently aligning second series containing said second group of said corresponding inserted mechanical fasteners, said corresponding inserted mechanical fasteners reversibly attaching said first rigid horizontal component to said second rigid horizontal component so each horizontal length of each said rigid horizontal component is in vertical alignment to the other.

\* \* \* \* \*